United States Patent
Deng et al.

(10) Patent No.: US 9,581,903 B2
(45) Date of Patent: Feb. 28, 2017

(54) POLYMER DYE AND METHOD FOR PREPARING THE SAME, PHOTORESIST COMPOSITION AND DISPLAY DEVICE

(71) Applicant: BOE TECHNOLOGY GROUP CO., LTD., Beijing (CN)

(72) Inventors: Wei Deng, Beijing (CN); Xiaoxiong Tian, Beijing (CN); Zhuo Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 174 days.

(21) Appl. No.: 14/547,003

(22) Filed: Nov. 18, 2014

(65) Prior Publication Data
US 2016/0041466 A1  Feb. 11, 2016

(30) Foreign Application Priority Data
Aug. 6, 2014  (CN) .......................... 2014 1 0383892

(51) Int. Cl.
| G03F 7/028 | (2006.01) |
| G02B 5/20 | (2006.01) |
| G03F 7/038 | (2006.01) |
| G03F 7/00 | (2006.01) |
| G02B 5/22 | (2006.01) |
| G03F 7/031 | (2006.01) |

(52) U.S. Cl.
CPC ............. *G03F 7/0388* (2013.01); *G02B 5/223* (2013.01); *G03F 7/0007* (2013.01); *G03F 7/028* (2013.01); *G03F 7/031* (2013.01)

(58) Field of Classification Search
CPC ........ G03F 7/0007; G03F 7/027; G03F 7/032; G03F 7/033; G03F 7/028; G03F 7/031; G02B 5/223; G02F 1/133514; G02F 1/133516; C09B 69/10; C09B 69/103; C09B 69/106; C08F 220/14; C08F 220/18; C08F 220/36
USPC ............. 430/7, 270.1, 288.1, 281.1; 369/106
See application file for complete search history.

(56) References Cited
U.S. PATENT DOCUMENTS

| 2007/0117031 A1* | 5/2007 | Mizukawa ............ C08F 220/28 430/7 |
| 2015/0162555 A1* | 6/2015 | Wu ........................ G11C 13/04 365/114 |

FOREIGN PATENT DOCUMENTS

| CN | 1142510 A | 2/1997 |
| CN | 1377389 A | 10/2002 |
| CN | 102221778 A | 10/2011 |
| CN | 102300885 A | 12/2011 |
| CN | 102702420 A | 10/2012 |
| CN | 103073668 A | 5/2013 |
| CN | 103159904 A | 6/2013 |
| EP | 0706095 A1 | 10/1996 |

OTHER PUBLICATIONS

Xie et al., "Microstructure of Copolymers Containing Disperse Red 1 and Methyl Methacrylate"; DTIC technical report (Mar. 1994).*
(Continued)

*Primary Examiner* — John A McPherson
(74) *Attorney, Agent, or Firm* — Kinney & Lange, P.A.

(57) ABSTRACT

The disclosure relates to display technology field, especially relates to a polymer dye and a method for preparing the same, a photoresist composition, a color photoresist, and a display device. The polymer dye is formed by the copolymerization of an acrylated dye represented by General Formula I and an acrylic acid or acrylate represented by General Formula II, in General Formula I, Dye represents a residue of a dye containing an aromatic hydroxyl group or an aromatic amino group, $R_1$, $R_2$, and $R_3$ are each independently selected from a hydrogen atom or an alkyl group having from 1 to 10 carbon atoms; in General Formula II, $R_4$, $R_5$, $R_6$, and $R_7$ are each independently selected from a hydrogen atom or an alkyl group having from 1 to 10 carbon atoms; the mole numbers of the acrylated dye represented by General Formula I and the acrylic acid or acrylate represented by General Formula II are x and y, respectively, and x:y=1:0.05-10; and the weight average molecular weight of the polymer dye is 2000-50000. The color photoresist produced employing the technical solution of the present disclosure avoids flooding, and improves the display quality of the display.

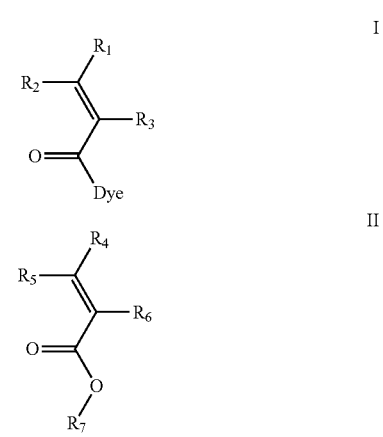

13 Claims, No Drawings

(56) References Cited

OTHER PUBLICATIONS

Rochon et al., "Optically Induced and Erased Birefringence and Dichroism in Azoaromatic Polymers"; Applied Physics Letters 60, 4 (Jan. 1992).*
First Office Action issued by SIPO on Aug. 8, 2015 for corresponding CN Application No. 201410383892.8, 9 pages.
Second Chinese Office Action dated Apr. 5, 2016 for corresponding CN Application No. 201410383892.8.
Third Chinese Office Action, for Chinese Patent Application No. 2014103838928, dated Sep. 27, 2016, 11 pages.

* cited by examiner

POLYMER DYE AND METHOD FOR PREPARING THE SAME, PHOTORESIST COMPOSITION AND DISPLAY DEVICE

CROSS-REFERENCE TO RELATED APPLICATION

This application is based on and claims the priority of Chinese Patent Application No. 201410383892.8, which is incorporated herein by reference in its entirety.

TECHNICAL FIELD

The present disclosure relates to display technology field, especially relates to a polymer dye and a method for preparing the same, a photoresist composition, a color photoresist and a display device.

BACKGROUND

At present, the primary structure of Thin Film Transistor Liquid Crystal Display, (abbreviated to TFT-LCD) comprises an array substrate and a color film substrate (CF) which are box aligned each other, wherein the color film substrate mainly comprises a glass substrate, a black matrix, a color photoresist, and a protection film. In general, the black matrix is arranged in a form of grating, stripe, or dapple between the color pattern formed of the color photoresist. The main function of the black matrix is for blocking scattering light, to avoid the light leak between pixels; the main function of the color photoresist is to produce red-green-blue tricolors by means of color filtering, and then mixing red-green-blue tricolors in different strength ratios to present various colors, such that TFT-LCD displays the full color.

Generally, the main components of a photoresist composition comprise a colorant, an alkali soluble resin, a multi-functional monomer, a photo initiator and so on. In the existing photoresist compositions, a pigment is generally employed as the colorant, and the color mixing is generally performed by adding yellow pigment into the red photoresist and the green photoresist, respectively, and by adding purple pigment into the blue photoresist. However, the contrast of the presently available purple pigment is low, and thereby a purple dye is used for replacing purple pigment in some companies in the art. The photoresist composition is subjected to coating, exposure, and development to form a color photoresist. The dye generally has good solubility in a solvent, therefore in the subsequent development process after the photoresist composition is subjected to exposure, the dye is easily carried away with the developer; in addition, in the further subsequent process of coating the protection film, the dye may enter into the protection film. Therefore, both of the above described two situations may bring about markedly flooding and color shift to the pixel unit.

The defect of the prior art is that, it is easy for the dye in the existing photoresist composition to form flooding, leading to the degradation of the display quality of the display panel.

SUMMARY

Some embodiments of the present disclosure relate to a polymer dye, formed by the copolymerization of an acrylated dye represented by General Formula I and an acrylic acid or acrylate represented by General Formula II:

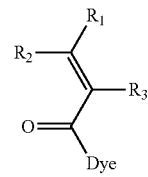

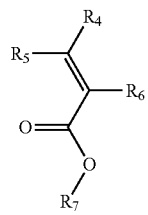

wherein, in General Formula I, Dye represents a residue of a dye containing an aromatic hydroxyl group or an aromatic amino group, $R_1$, $R_2$ and $R_3$ are each independently selected from a hydrogen atom or an alkyl group having from 1 to 10 carbon atoms; in General Formula II, $R_4$, $R_5$, $R_6$ and $R_7$ are each independently selected from a hydrogen atom or an alkyl group having from 1 to 10 carbon atoms;

the mole numbers of the acrylated dye represented by General Formula I and the acrylic acid or acrylate represented by General Formula II are x and y, respectively, and $x:y=1:0.05-10$; and the weight average molecular weight of the polymer dye is 2000-50000.

Some embodiments of the present disclosure relate to a photoresist composition, comprising:

10-60 weight parts of the above described polymer dye;
10-60 weight parts of an alkali soluble resin;
5-50 weight parts of a multi-functional monomer;
0.5-10 weight parts of a photo initiator;
100-450 weight parts of an organic solvent; and
0-5 weight parts of an auxiliary agent.

Some embodiments of the present disclosure relate to a color photoresist obtained by using the above described photoresist composition.

Some embodiments of the present disclosure relate to a display device, comprising the above described color photoresist.

Some embodiments of the present disclosure relate to a preparation method of the polymer dye, comprising:

step a) of subjecting the dye containing an aromatic hydroxyl or aromatic amino group to a substitution reaction with an acryl halide, and removing hydrogen halide, to produce the acrylated dye represented by General Formula I; and step b) of subjecting the acrylated dye represented by General Formula I to a copolymerization reaction with the acrylic acid or acrylate represented by General Formula II, to form the polymer dye, wherein the mole numbers of the acrylated dye represented by General Formula I and of the acrylic acid or acrylate represented by General Formula II are x and y, respectively, and $x:y=1:0.05-10$, and the weight average molecular weight of the polymer dye is from 2000 to 50000.

DETAILED DESCRIPTION

The present disclosure provides a polymer dye and a method for preparing the same, a photoresist composition, a color photoresist and a display device, for the purpose of reducing flooding, and improving the display quality of the display panel.

According to embodiments of the present disclosure, it is provided a polymer dye formed by the copolymerization of an acrylated dye represented by General Formula I and an acrylic acid or acrylate represented by General Formula II:

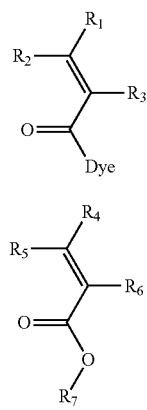

wherein, in General Formula I, Dye represents a residue of a dye group containing an aromatic hydroxyl group or an aromatic amino group, $R_1$, $R_2$, and $R_3$ are each independently selected from a hydrogen atom or an alkyl group having from 1 to 10 carbon atoms; and in General Formula II, $R_4$, $R_5$, $R_6$, and $R_7$ are each independently selected from a hydrogen atom or an alkyl group having from 1 to 10 carbon atoms;

the mole numbers of the acrylated dye represented by General Formula I and the acrylic acid or acrylate represented by General Formula II are x and y, respectively, and x:y=1:0.05-10; and the weight average molecular weight of the polymer dye is 2000-50000.

This polymer dye is formed by bonding the dye onto a polymer. Because the solubility of the polymer dye with high molecular weight is lower than the solubility of the simple dye molecules, it will not be easily redissolved out by a solvent, so tht it avoids flooding, improves the stability of the color, and improves the display quality of the display.

In the above described technical solution of the present disclosure, the polymer dye is substantially a copolymer having a dye residue, with two structural units of the copolymer being the acrylated dye represented by General Formula I and the acrylic acid or acrylate represented by General Formula II, respectively. In the copolymerization process, an addition reaction is carried out between the carbon-carbon double bond in the acrylated dye and the carbon-carbon double bond in the acrylic acid or acrylate. Of course, the addition reaction either may be the addition of the carbon-carbon double bonds in two acrylated dye molecules, or may be the addition of the carbon-carbon double bonds in two acrylic acid or acrylate molecules.

In the present disclosure, Dye represents a residue of a dye containing an aromatic hydroxyl group or an aromatic amino group, wherein the hydroxyl group in the dye containing an aromatic hydroxyl group is active, so that it is easy for the hydrogen atom of the hydroxyl group and the halogen atom of the acryloyl halide to be carry out a hydrogen halide eliminating reaction, and similarly, the amino in the dye containing an aromatic amino group is active, so that it is easy for the hydrogen atom of the amino group and the halogen atom of the acryloyl halide to carry out a hydrogen halide eliminating reaction. The amino group may be $—NH_2$ or $—NH—$. The dye may be Disperse Red 1, and may also be Acid Red 14, Acid Red 20, Acid Red 33, Acid Red 35, Acid Red 337, Acid Yellow 9, Acid Red 17, Acid Green 10, Acid Blue 7, Acid Blue 9, Acid Blue 62, Acid Blue 120, Acid Purple 43, Acid Purple 49, Acid Orange 24, Acid Black 1, Solvent Purple 3, Solvent Purple 13, Solvent Purple 14, and the like.

The mole numbers of the acrylated dye represented by General Formula I and the acrylic acid or acrylate represented by General Formula II are x and y, respectively, and x:y=1: (0.05-10), for example, x:y=1:0.05, x:y=1:0.1, x:y=1:0.5, x:y=1:1, x:y=1:2, x:y=1:5, x:y=1:8, and x:y=1:10. The weight average molecular weight of the polymer dye is 2000-50000, for example, the weight average molecular weight of the polymer dye is 2000-20000, or 5000-50000.

In General Formula I, $R_1$, $R_2$, and $R_3$ should not be too large, to avoid excessive steric hindrance in the addition copolymerization reaction, since large steric hindrance is not favorable for the conduction of the addition reaction. In some embodiments, $R_1$, $R_2$, and $R_3$ are each independently selected from a hydrogen atom or an alkyl group having from 1 to 10 carbon atoms. Similarly, in General Formula II, $R_4$, $R_5$, $R_6$, and $R_7$ are each independently selected from a hydrogen atom or an alkyl group having from 1 to 10 carbon atoms. The alkyl group having from 1 to 10 carbon atoms may be methyl, ethyl, propyl, butyl, pentyl, hexyl, heptyl, octyl, nonyl, or decyl.

In order to further reduce the steric hindrance during the copolymerization reaction, in some embodiments, $R_1$, $R_2$ and $R_3$ are each independently selected from a hydrogen atom or an alkyl group having from 1 to 4 carbon atoms; and $R_4$, $R_5$, $R_6$ and $R_7$ are each independently selected from a hydrogen atom or an alkyl group having from 1 to 4 carbon atoms.

In some embodiments, $R_1$ and $R_2$ are each a hydrogen atom, $R_3$ is methyl, $R_4$, $R_5$ and $R_6$ are each a hydrogen atom, $R_7$ is butyl; and the weight average molecular weight of the polymer dye is 2000-20000; or $R_1$ and $R_2$ are each a hydrogen atom, $R_3$ is methyl, $R_4$ and $R_5$ are each a hydrogen atom, $R_6$ and $R_7$ are each methyl; and the weight average molecular weight of the polymer dye is 5000-50000.

In some embodiments, the Dye is specifically the dye residue represented by Formula III:

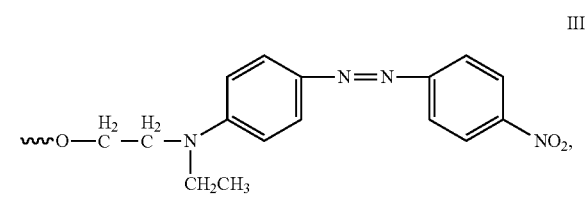

wherein $\sim\!\!\sim\!\!\sim O$ means that the oxygen atom is connected to the carbon atom of the carbonyl in General Formula I. The dye residue represented by Formula III is the dye residue obtained by removing the hydrogen atom of the hydroxyl group of Disperse Red 1 dye molecule.

Embodiments of the present disclosure further provide a photoresist composition, comprising:

10-60 weight parts of any one of the above described polymer dyes;
10-60 weight parts of an alkali soluble resin;
5-50 weight parts of a multi-functional monomer;
0.5-10 weight parts of a photo initiator;
100-450 weight parts of an organic solvent; and
0-5 weight parts of an auxiliary agent.

In the photoresist composition of the present disclosure, any one of the above described polymer dyes is used as the colorant. Because the polymer dye has relatively low solubility comparing with simple dye molecules, the polymer dye is not easy to be dissolved out during the subsequent development or coating of other resist, thereby avoiding flooding, such that the display quality of the display is greatly improved.

The photoresist composition of the present disclosure may comprise a pigment and/or other dye than the polymer dye of the present disclosure, to form the colorant together. Generally, the colorant, including dye and pigment and the like, endows the photoresist composition special color or conducts color filtering. In the photoresist composition of the present disclosure, the colorant may all employ the polymer dye of the present disclosure, and may also employ the polymer dye and other pigment or dye at the same time. When the colorant comprises both dye and pigment, the colorant may be formed by using any one of the above described polymer dyes at a mass percentage of 90%-99% and a pigment at a mass percentage of 1%-10%.

When the parts by weight of the polymer dye in the colorant are smaller, the color gamut is smaller; when the parts by weight of the alkali soluble resin are smaller, it causes the edge residue of the pixels; when the parts by weight of the alkali soluble resin are larger, it may influence the fine line retention rate; when the parts by weight of the multi-functional monomer are smaller, it causes that the curing of pixels is not enough, and when the parts by weight of the multi-functional monomer is larger, it causes the edge residue of the pixels; when the weight parts of the photo initiator are smaller, it causes that the curing of pixels is not enough; when weight parts of photo initiator are larger, the cost is higher; the organic solvent is used for adjusting the viscosity of the photoresist composition, and when the weight parts of the organic solvent are too high or too small, the viscosity of the photoresist composition is too high or too low, both of which may cause the difficulty of the film forming.

In some embodiments, the alkali soluble resin includes a resin having an acidic group or an ammonium group; the multi-functional monomer includes a polymerizable acrylate monomer; the photo initiator includes one or more of benzil acetal, dialkoxy acetophenone, hydroxyl alkyl phenyl ketone, amino alkyl phenyl ketone, acylphosphine oxide, benzophenone, Michler's ketone, an aryl iodonium salt or a sulphonium salt; the organic solvent includes one or more of an alcohol-ether type solvent, an aromatic hydrocarbon based solvent, a ketone solvent, or an alkane solvent; the auxiliary agent includes one or more of a leveling agent, a defoamer, an antioxidant, or an ultraviolet stabilizer.

In the colorant of the photoresist composition, the pigment may be a red pigment, such as P.R.122, P.R.177, P.R.179, P.R.202, P.R.224, P.R.254, P.R.255, P.R.264, P.R.270, and the like; a yellow pigment, such as P.Y.12, P.Y.13, P.Y.83, P.Y.94, P.Y.95, P.Y.126, P.Y.138, P.Y.139, P.Y.147, P.Y.180, and the like; an orange pigment, such as P.O.16, P.O.34, P.O.49, P.O.71, P.O.73, and the like; a green pigment, such as P.G. 36, P.G.37, P.G.58, and the like; a blue pigment, such as P.B.1, P.B.15, P.B.15:3, P.B.15:6, P.B.22, P.B.66, and the like; a purple pigment, such as P.V.23, P.V.32, P.V.36, P.V.38, P.V.39, and the like. The dye may be an azo dye, an anthraquinone dye, a triaryl methane dye, an azine dye, an indigo dye, a quinoline dye, a xanthene dye, a nitroso dye, and the like. The specific dyes are, for example, Acid Red 14, Acid Red 20, Acid Red 33, Acid Red 35, Acid Red 88, Acid Yellow 9, Acid Red 17, Acid Green 10, Acid Blue 7, Acid Blue 9, Acid Blue 62, Acid Blue 120, Acid Purple 43, Acid Purple 49, Acid Orange 24, Acid Black 1, Disperse Red 11, Disperse Red 15, Disperse Red 17, Disperse Black 9, Disperse Purple 1, Disperse Purple 4, Disperse Purple 8, Disperse Purple 15, Disperse Blue 1, Disperse Blue 3, Disperse Blue 7, Basic Red 22, Basic Red 76, Basic Yellow 23, Basic Yellow 36, Basic Yellow 57, Basic Green 1, Basic Blue 7, Basic Blue 22, Basic Blue 26, Basic Blue 29, Basic Brown 16, Basic Brown 17, Basic Orange 7, Solvent Purple 3, Solvent Purple 13, Solvent Purple 14, and the like. The dye may also be any one of the polymer dyes in the present disclosure.

The alkali soluble resin generally comprises an acidic group which is helpful for the dissolution in an alkaline developer, and an acrylate, a conjugated olefin, and the like which may be polymerized under the irradiation of an ultraviolet light, specifically, for example, an alkali soluble resin obtained by a radical polymerization, an anionic polymerization, or a cationic polymerization reaction of a (meth)acrylate, maleic anhydride, and a modified styrene; a polyimide, a modified epoxy resin, a polyolefin resin, a polyester resin, a phenolic resin, an urea-formaldehyde resin, and the like. Possible examples of the alkali soluble resin include but not limited to, Mitsubishi Rayon resin CZ1705, CZ1706, Taiwan Daxin resin A14, A15, A16, Nippon Kayaku CCR-4959HW, PCR-2014HW, KR-02, ER-4010W, EAM-2160W, R-190W, R-115W, CAN-1001, K200D25W, K150D10W, UX-5000W, UX-5005W, UXF-6006W, UX-6010W, KCW661W, DVD802, etc.

In some embodiments, the alkali soluble resin includes an acryl resin, an epoxy resin, a polyolefin resin, a polyester resin, a phenolic resin or an urea-formaldehyde resin; the polymerizable acrylate monomer includes pentaerythritol tetraacrylate, pentaacrylate, dipentaerythritol penta- or hexaacrylate, aliphatic polyurethane hexaacrylate, propoxylated neopentanediol diacrylate, ethoxylated trihydroxymethyl propane triacrylate, ethoxylated pentaerythritol tetraacrylate, trihydroxyethyl isocyanurate triacrylate, dipropylene glycol diacrylate, tripropylene glycol diacrylate, trihydroxymethyl propane triacrylate, aliphatic polyurethane diacrylate, trihydroxymethyl propane triacrylate, or aliphatic polyurethane hexaacrylate; the alcohol-ether type solvent includes dipropylene glycol methyl ether, propylene glycol methyl ether, tripropylene glycol methyl ether, dipropylene glycol dimethyl ether, propylene glycol propyl ether, dipropylene glycol propyl ether, propylene glycol methyl ether acetate, dipropylene glycol methyl ether acetate, propylene glycol butyl ether, dipropylene glycol butyl ether, tripropylene glycol butyl ether, propylene glycol phenyl ether, ethylene glycol phenyl ether, propylene glycol diacrylate, diethylene glycol ethyl ether, diethylene glycol butyl ether, diethylene glycol hexyl ether, diethylene glycol butyl ether acetate, ethylene glycol butyl ether acetate, ethylene glycol butyl ether, ethylene glycol hexyl ether, ethyl 3-ethoxy propionate.

In some embodiments, the aromatic hydrocarbon based solvent includes toluene, ethylbenzene, chlorobenzene, nitrobenzene, o-xylene, m-xylene or p-xylene; the ketone solvent comprises butanone, hexanone, or cyclohexanone; the alkane solvent includes n-hexane, cyclohexane, rosin water (that is, 200# solvent gasoline), or kerosene.

The auxiliary agent includes a leveling agent, a defoamer, a substrate wetting agent, an antioxidant, an ultraviolet stabilizer, and the like. Specifically, an anti-crater auxiliary agent such as Degussa ATF2; a leveling agent such as Degussa Flow 245, Degussa Flow 370, Degussa Flow 432, and Degussa Flow 435, Degussa Flow 450, BYK306, BYK307, BYK378, and BYK057; a defoamer such as Ciba EFKA 2721, GE Coatsil 7510, GE Coatsil 2810, Degussa Airex 920, and Degussa Airex 932; an antioxidant such as Chinox 35, Chinox 1010, and Chinox TP-20 may be employed.

Embodiments of the present disclosure further provide the use of the above described photoresist composition, comprising at least the following three aspects:

a color photoresist, obtained by employing the above described photoresist composition;

a color film substrates, comprising a base substrate and a color photoresist on the base substrate, the color photoresist being obtained by employing the above described photoresist composition; and a display device, comprising the above described color photoresist. The other structures of the display device may all employ the existing structures. For example, the structure of the display device may comprise a color film substrate, an array substrate opposite to the color film substrate, and a liquid crystal layer between the color film substrate and the array substrate. The display device may be any device having a display component such as a liquid crystal television, a computer, a mobile telephone, and the like.

The preparation method of the polymer dye of the present disclosure may comprise:

step a) of subjecting the dye containing an aromatic hydroxyl group or an aromatic amino group to a substitution reaction with an acryl halide, removing hydrogen halide, to produce the acrylated dye represented by General Formula I; and step b) of subjecting the acrylated dye represented by General Formula I and the acrylic acid or acrylate represented by General Formula II to a copolymerization reaction, to form the polymer dye, wherein the mole numbers of the acrylated dye represented by General Formula I and the acrylic acid or acrylate represented by General Formula II are x and y, respectively, and x:y=1:0.05-10, and the weight average molecular weight of the polymer dye is 2000-50000.

The preparation method of the photoresist composition of the present disclosure may comprise a step of weighting the polymer dye, the alkali soluble resin, the multi-functional monomer, the photo initiator, the auxiliary agent, and the organic solvent according to the respective weight parts, dissolving and mixing them.

The following examples specifically illustrate the polymer dye and the method for preparing the same, the photoresist composition and the preparation method thereof of the present disclosure. However, the present disclosure is not limited to the following examples. It should be noticed that, if it is not specifically pointed out, each component in the photoresist composition is represented in term of weight parts.

Example 1

Into a three-necked flask provided with a thermometer, a stirrer and a dropping funnel, 1.05 molar parts of methacryloyl chloride (85 weight parts), 800 weight parts of propylene glycol methyl ether acetate (PMA), and 800 weight parts of toluene were added. Separately, 1 molar part of Disperse Red 1 dye (314 weight parts), 80 weight parts of pyridine, 1200 weight parts of PMA, and 1200 weight parts of toluene were uniformly mixed to form a mixed liquid, which was slowly added into the three-necked flask through the dropping funnel. The reaction temperature was controlled below 5° C. with an ice water bath. After the addition was completed, the reactants were mixed at room temperature over night, and then settled and filtered. Into the filtrate, 0.1 weight parts of p-tert-butyl tert-butyl catechol as a polymerization inhibitor was added, and then the filtrate was distillated under a reduced pressure to remove solvent, and a red methacrylated dye was obtained. The results of the infrared spectrograph test were as following: IR (KBr, cm$^{-1}$): 1718 (s, C=O), 1600, 1500 (s, benzene ring), 1360 (b, C—H). The chemistry reaction equation thereof is as following:

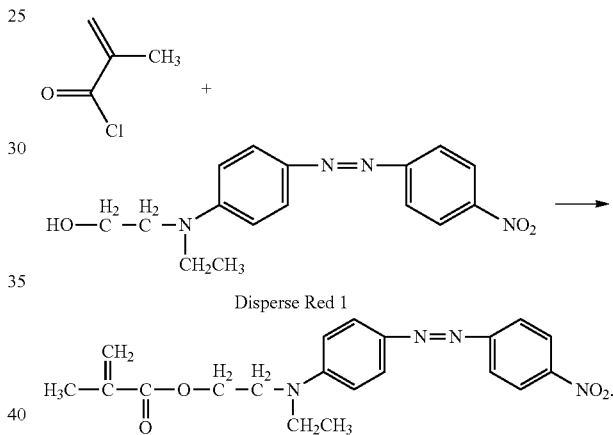

Into a three-necked flask provided with a thermometer, a stirrer and a dropping funnel, 1 molar part of the methacrylated dye (384 weight parts), 5 molar parts of butyl acrylate (640 weight parts), 0.1 molar parts of azodiisobutyronitrile (15 weight parts), 1200 weight parts of PMA, and 1200 weight parts of toluene were added, heated to 70° C., and reacted for 48 hours, thereby the polymethacrylate A containing dye, that is, the polymer dye A was obtained. After removing excessive solvent by distillation under a reduced pressure, a pure red polymer dye A was obtained. Upon test, its weight average molecular weight was between 8000-20000, and its glass transition temperature Tg was 90° C. The results of the infrared spectrograph test were as following: IR (KBr, cm$^{-1}$): 1718 (s, C=O), 1600, 1500 (s, benzene ring), 1360 (b, C—H). In this reaction, the carbon-carbon double bond in the methacrylated dye molecule and the carbon-carbon double bond in the butyl acrylate molecule were opened, respectively, and an addition reaction was carried out therebetween.

Example 2

Into a three-necked flask provided with a thermometer, a stirrer and a dropping funnel, 1.05 molar parts of methacryloyl chloride (85 weight parts), 800 weight parts of PMA, and 800 weight parts of toluene were added. Separately, 1 molar part of Disperse Red 1 dye (314 weight parts), 80 weight parts of pyridine, 1200 weight parts of PMA, and 1200 weight parts of toluene were uniformly mixed to form a mixed liquid, which was slowly added into the three-necked flask through the dropping funnel. The reaction temperature was controlled below 5° C. with an ice water bath. After the addition was completed, the reactants were mixed at room temperature over night, and then settled and filtered. Into the filtrate, 0.1 weight parts of p-tert-butyl catechol was added as a polymerization inhibitor, and then the filtrate was distillated under a reduced pressure to remove solvent, and a red methacrylated dye was obtained. The results of the infrared spectrograph test were as following: IR (KBr, cm$^{-1}$): 1718 (s, C=O), 1600, 1500 (s, benzene ring), 1360 (b, C—H). The chemistry reaction equation thereof is as following:

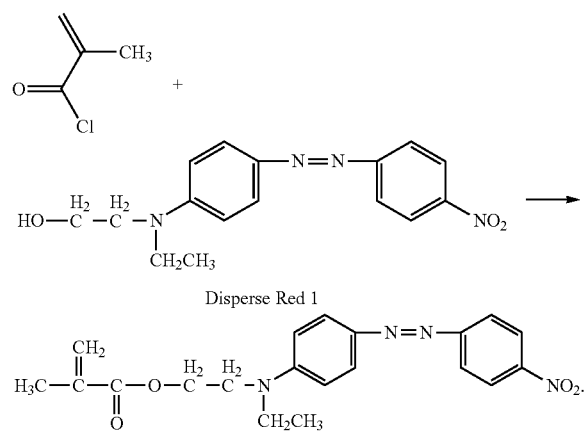

Disperse Red 1

Into a three-necked flask provided with a thermometer, a stirrer and a dropping funnel, 1 molar part of the methacrylated dye (384 weight parts), 5 molar parts of methyl methacrylate (500 weight parts), 0.1 molar parts of azodiisobutyronitrile (15 weight parts), 1200 weight parts of PMA, and 1200 weight parts of toluene were added, heated to 70° C., and reacted for 48 hours, thereby the polymethacrylate B containing dye, that is, the polymer dye B was obtained. After removing excessive solvent by distillation under a reduced pressure, a pure red polymer dye B was obtained. Upon test, its weight average molecular weight was between 15000-50000, and its glass transition temperature Tg was 100° C. The results of the infrared spectrograph test were as following: IR (KBr, cm$^{-1}$): 1718 (s, C=O), 1600, 1500 (s, benzene ring), 1360 (b, C—H). In this reaction, the carbon-carbon double bond in the methacrylated dye molecule and the carbon-carbon double bond in the butyl acrylate molecule were opened, respectively, and an addition reaction was carried out therebetween.

Preparation of Photoresist Composition

The polymer dyes A and B obtained in Example 1 and Example 2 were employed, respectively, together with other components of photoresist composition, to prepare photoresist composition 1 and photoresist composition 2.

Preparation of photoresist composition 1: 10-60 weight parts of the colorant were dispersed with a sand mill to a stable state, after that, it was mixed with 10-60 weight parts of alkali soluble resin, 5-50 weight parts of multi-functional monomer, 0.5-10 weight parts of photo initiator, 0-5 weight parts of auxiliary agent, and 100-450 weight parts of organic solvent, stirred at a low speed for 10-12 hours, and filtered to obtain the photoresist composition 1, wherein the colorant was the polymer dye A prepared in Example 1. For example, the respective components and the weight parts thereof of the photoresist composition may be: 10 weight parts, 35 weight parts, or 60 weight parts of the polymer dye A obtained in Example 1; 10 weight parts, 20 weight parts, 25 weight parts, 30 weight parts, 35 weight parts, 50 weight parts, or 60 weight parts of the alkali soluble resin; 5 weight parts, 18 weight parts, 20 weight parts, 40 weight parts, or 50 weight parts of the multi-functional monomer; 0.5 weight part, 2 weight parts, 5 weight parts, 8 weight parts, or 10 weight parts of the photo initiator; 0 weight part, 2 weight parts, 4 weight parts, or 5 weight parts of the auxiliary agent; 100 weight parts, 200 weight parts, 350 weight parts, or 450 weight parts of the organic solvent. Only the components of one photoresist composition and their weight parts were illustrated herein, and they were omitted for other photoresist compositions for simplicity. The components and their weight parts of this photoresist composition were shown in the following table:

| Respective components of the photoresist composition 1 | | Weight parts |
|---|---|---|
| Colorant | Polymer dye A | 48 weight parts |
| Alkali soluble resin | Daxin Acrylate Resin A16 | 25 weight parts |
| Multi-functional monomer | Dipentaerythritol pentaacrylate (DPHA) | 20 weight parts |
| Photo initiator | OXE01 | 3 weight parts |
| Organic solvent | PMA | 320 weight parts |
| | Cyclohexanone | 100 weight parts |

Preparation of photoresist composition 2: 10-60 weight parts of the colorant were dispersed with a sand mill to a stable state, after that, it was mixed with 10-60 weight parts of alkali soluble resin, 5-50 weight parts of multi-functional monomer, 0.5-10 weight parts of photo initiator, 0-5 weight parts of auxiliary agent, and 100-450 weight parts of organic solvent, stirred at a low speed for 10-12 hours, and filtered to obtain the photoresist composition 2, wherein the colorant was the polymer dye B prepared in Example 2. For example, the respective components and the weight parts thereof of the photoresist composition may be: 10 weight parts, 35 weight parts, or 60 weight parts of the polymer dye B obtained in Example 2; 10 weight parts, 20 weight parts, 25 weight parts, 30 weight parts, 35 weight parts, 50 weight parts, or 60 weight parts of the alkali soluble resin; 5 weight parts, 18 weight parts, 20 weight parts, 40 weight parts, or 50 weight parts of the multi-functional monomer; 0.5 weight part, 2 weight parts, 5 weight parts, 8 weight parts, or 10 weight parts of the photo initiator; 0 weight part, 2 weight parts, 4 weight parts, or 5 weight parts of the auxiliary agent; 100 weight parts, 200 weight parts, 350 weight parts, or 450 weight parts of the organic solvent. Only the components of one photoresist composition and their weight parts were illustrated herein, and they were omitted for other photoresist compositions for simplicity. The components and their weight parts of this photoresist composition were shown in the following table:

| Respective components of the photoresist composition 2 | | Weight parts |
|---|---|---|
| colorant | polymer dye B | 48 weight parts |
| alkali soluble resin | Daxin Acrylate Resin A16 | 25 weight parts |
| multi functional monomer | dipentaerythritol pentaacrylate (DPHA) | 20 weight parts |
| photo initiator | OXE01 | 3 weight parts |

| Respective components of the photoresist composition 2 | | Weight parts |
|---|---|---|
| organic solvent | PMA | 320 weight parts |
| | cyclohexanone | 100 weight parts |

Comparative Example 1

Preparation of Photoresist Composition 3

10-60 weight parts of the colorant were dispersed with a sand mill to a stable state, and then mixed with 10-60 weight parts of alkali soluble resin, 5-50 weight parts of multi-functional monomer, 0.5-10 weight parts of photo initiator, 0-5 weight parts of auxiliary agent, and 100-450 weight parts of organic solvent, stirred at a low speed for 10-12 hours, and filtered to obtain the photoresist composition 3. Only the components of one photoresist composition and their weight parts were illustrated herein, and they were omitted for other photoresist compositions for simplicity. The components and their weight parts of this photoresist composition were shown in the following table:

| Respective components of the photoresist composition 3 | | Weight parts |
|---|---|---|
| Colorant | Disperse Red 1 | 28 weight parts |
| Alkali soluble resin | Daxin Acrylate Resin A16 | 28 weight parts |
| Multi-functional monomer | Dipentaerythritol pentaacrylate (DPHA) | 26 weight parts |
| Photo initiator | OXE01 | 3 weight parts |
| Organic solvent | PMA | 320 weight parts |
| | Cyclohexanone | 100 weight parts |

Test Method

The above described photoresist compositions 1-3 were coated onto 3 glass substrates (Sheet 1, Sheet 2, and Sheet 3) provided with black matrix, respectively, and the film thickness of the coatings were all 2.0 micrometers. The sheets were baked in an oven at 100° C. for 2 minutes, and then irradiated by ultraviolet light in an exposure machine, and developed in a developing solution at room temperature for 25-50 seconds. After washing with deionized water, the patterns were finally cured by heating, dried, and the color photoresists were obtained. Formulated photoresist for plain protection layer was then coated onto a glass substrate by a coating device such as spinning coating, scrape coating, or the like, to form a film layer with prescribed thickness. The film layer was dried to from a film, and thus the plain protection layer was obtained.

The tests were conducted for Sheet 1, Sheet 2, and Sheet 3 in the following manner:

Appearance: observe the obtained Sheet 1-Sheet 3 with naked eye;

Exposure sensitivity: the ultraviolet light energy required for exposure and curing;

Gradient angle: gradient angle of pixel edge obtained by observation under scanning electron microscope;

Adhesion: the preserving situation of the pixels with respect to the substrate, such as peeling off or indention lines on the edge, by observation under microscope;

Appearance after covering with a recoated plain protection layer: observe with naked eye to check whether there is flooding after the secondary coating of plain protection layer and the corresponding exposure and development.

TABLE 1

| Testing results of sheets 1-3 | | | |
|---|---|---|---|
| Test Items | Sheet 1 | Sheet 2 | Sheet 3 |
| Appearance | ○ | ○ | Δ |
| Exposure Sensitivity | 100 mJ | 100 mJ | 120 mJ |
| Gradient Angle | ○ | Δ | Δ |
| Adhesion | ○ | ○ | Δ |
| Appearance after covering with a recoated plain protection layer | ○ | ○ | X |

In Table 1, ○ represents good, A represents qualified, X represents disqualified. From the test results of Table 1 it can be seen that, the performances of the color photoresist prepared employing the polymer dye A or B obtained in the present disclosure are more stable, having good appearance, exposure sensitivity and gradient angle, and having good adhesion, uniform edge of the resist, no indention, and substantively no flooding, while the one obtained employing the existing small molecular dye has serious flooding phenomena, which seriously influences the display quality.

Obviously, a person skilled in the art may make various changes and alternatives to the present disclosure without departing from the spirit and the scope of the present disclosure. Thus, if these changes and alternatives of the present disclosure fall within the scope of the claims of the present disclosure and the equivalents thereof, the present disclosure also intends to include these changes and alternatives.

What is claimed is:

1. A photoresist composition, comprising:
   10-60 weight parts of a polymer dye;
   10-60 weight parts of an alkali soluble resin;
   5-50 weight parts of a multi-functional monomer;
   0.5-10 weight parts of a photo initiator;
   100-450 weight parts of an organic solvent; and
   0-5 weight parts of an auxiliary agent;
   wherein the polymer dye is formed by the copolymerization of an acrylated dye represented by General Formula I and an acrylic acid or acrylate represented by General Formula II:

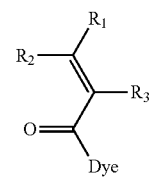

I

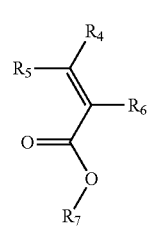

II wherein, in General Formula I, Dye represents a residue of a dye selected from the group consisting of Disperse Red 1, Acid Red 14, Acid Red 20, Acid Red 33, Acid Red 35, Acid Red 337, Acid Yellow 9, Acid Red 17, Acid Green 10, Acid Blue 7, Acid Blue 9, Acid Blue 62, Acid Blue 120, Acid Purple 43, Acid Purple 49, Acid Orange 24, Acid Black 1, Solvent Purple 3, Solvent Purple 13, and Solvent Purple 14; and $R_1$, $R_2$ and $R_3$ are each independently selected from a hydrogen atom or an alkyl group having from 1 to 10 carbon atoms; and in General Formula II, $R_4$ $R_5$ $R_6$ and $R_7$ are each independently selected from a hydrogen atom or an alkyl group having from 1 to 10 carbon atoms;

wherein the mole numbers of the acrylated dye represented by General Formula I and of the acrylic acid or acrylate represented by General Formula II are x and y, respectively, and x:y =1:0.05-10; and wherein the weight average molecular weight of the polymer dye is 2000-50000.

2. The photoresist composition of claim 1, wherein the alkali soluble resin comprises a resin having an acidic group or an ammonium group.

3. The photoresist composition of claim 2, wherein the alkali soluble resin includes an acryl resin, an epoxy resin, a polyolefin resin, a polyester resin, a phenolic resin or a urea-formaldehyde resin.

4. The photoresist composition of claim 1, wherein the multi-functional monomer includes a polymerizable acrylate monomer.

5. The photoresist composition of claim 4, wherein the polymerizable acrylate monomer includes pentaerythritol tetraacrylate, pentaacrylate, dipentaerythritol penta- or hexa-acrylate, aliphatic polyurethane hexaacrylate, propoxylated neopentanediol diacrylate, ethoxylated trihydroxymethyl propane triacrylate, ethoxylated pentaerythritol tetraacrylate, trihydroxyethyl isocyanurate triacrylate, dipropylene glycol diacrylate, tripropylene glycol diacrylate, trihydroxymethyl propane triacrylate, aliphatic polyurethane diacrylate, trihydroxymethyl propane triacrylate, or aliphatic polyurethane hexaacrylate.

6. A display device, comprising the color photoresist of claim 4.

7. The photoresist composition of claim 1, wherein the photo initiator comprises one or more of benzil acetal, dialkoxy acetophenone, hydroxyl alkyl phenyl ketone, amino alkyl phenyl ketone, acylphosphine oxide, benzophenone, Michler's ketone, an aryl iodonium salt, or a sulphonium salt.

8. The photoresist composition of claim 1, wherein the organic solvent includes one or more of an alcohol-ether type solvent, an aromatic hydrocarbon based solvent, a ketone solvent or an alkane solvent.

9. The photoresist composition of claim 8, wherein the alcohol-ether type solvent includes dipropylene glycol methyl ether, propylene glycol methyl ether, tripropylene glycol methyl ether, dipropylene glycol dimethyl ether, propylene glycol propyl ether, dipropylene glycol propyl ether, propylene glycol methyl ether acetate, dipropylene glycol methyl ether acetate, propylene glycol butyl ether, dipropylene glycol butyl ether, tripropylene glycol butyl ether, propylene glycol phenyl ether, ethylene glycol phenyl ether, propylene glycol diacrylate, diethylene glycol ethyl ether, diethylene glycol butyl ether, diethylene glycol hexyl ether, diethylene glycol butyl ether acetate, ethylene glycol butyl ether acetate, ethylene glycol butyl ether, ethylene glycol hexyl ether, ethyl 3-ethoxy propionate; the aromatic hydrocarbon based solvent includes toluene, ethylbenzene, chlorobenzene, nitrobenzene, o-xylene, m-xylene or p-xylene; the ketones solvent includes butanone, hexanone, or cyclohexanone; and the alkanes solvent includes n-hexane, cyclohexane, rosin water or kerosene.

10. The photoresist composition of claim 1, wherein the auxiliary agent includes one or more of a leveling agent, a defoamer, an antioxidant or an ultraviolet stabilizer.

11. The photoresist composition of claim 1, further comprising a pigment and/or a dye which is different from the polymer dye, and the mass percentage of the polymer dye in all pigment and dye is 90-99%.

12. A color photoresist, which is obtained by subjecting the photoresist composition of claim 1 to coating, exposure, and development.

13. The photoresist composition of claim 1, wherein, in General Formula I, Dye represents a dye residue represented by Formula III:

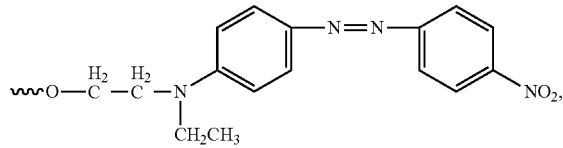

wherein,

∿O means that the oxygen atom is connected to the carbon atom of the carbonyl group in General Formula I.

* * * * *